(12) United States Patent
Bechtel et al.

(10) Patent No.: US 8,247,828 B2
(45) Date of Patent: Aug. 21, 2012

(54) ILLUMINATION DEVICE, PARTICULARLY WITH LUMINESCENT CERAMICS

(75) Inventors: Hans-Helmut Bechtel, Roetgen (DE); Wolfgang Busselt, Roetgen (DE); Peter J. Schmidt, Aachen (DE); Joerg Meyer, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 210 days.

(21) Appl. No.: 12/517,284

(22) PCT Filed: Nov. 30, 2007

(86) PCT No.: PCT/IB2007/054858
§ 371 (c)(1), (2), (4) Date: Jun. 2, 2009

(87) PCT Pub. No.: WO2008/068689
PCT Pub. Date: Jun. 12, 2008

(65) Prior Publication Data
US 2010/0059777 A1    Mar. 11, 2010

(30) Foreign Application Priority Data
Dec. 5, 2006 (EP) .................................. 06125458

(51) Int. Cl.
*H01L 33/00* (2010.01)
*H01L 29/20* (2006.01)
*F21V 13/00* (2006.01)
*F21V 5/00* (2006.01)

(52) U.S. Cl. ............... 257/98; 257/89; 257/E33.067; 257/E33.061; 362/242; 362/326; 362/327; 362/328; 362/329

(58) Field of Classification Search .............. None
See application file for complete search history.

(56) References Cited

U.S. PATENT DOCUMENTS

| | | | |
|---|---|---|---|
| 2,900,545 A | 8/1959 | Rulon et al. | |
| 6,696,703 B2* | 2/2004 | Mueller-Mach et al. | 257/98 |
| 6,744,077 B2* | 6/2004 | Trottier et al. | 257/103 |
| 6,982,522 B2* | 1/2006 | Omoto | 313/502 |
| 7,196,354 B1* | 3/2007 | Erchak et al. | 257/79 |
| 2002/0003233 A1* | 1/2002 | Mueller-Mach et al. | 257/84 |
| 2005/0051790 A1* | 3/2005 | Ueda | 257/99 |
| 2005/0269582 A1 | 12/2005 | Mueller et al. | |
| 2006/0012299 A1* | 1/2006 | Suehiro et al. | 313/512 |
| 2006/0091790 A1 | 5/2006 | Nagatomi et al. | |
| 2006/0145123 A1* | 7/2006 | Li et al. | 252/301.4 F |
| 2007/0120129 A1* | 5/2007 | DenBaars et al. | 257/79 |
| 2007/0138484 A1* | 6/2007 | Yamamoto et al. | 257/79 |
| 2007/0215890 A1* | 9/2007 | Harbers et al. | 257/98 |
| 2009/0026908 A1* | 1/2009 | Bechtel et al. | 313/110 |
| 2009/0072710 A1* | 3/2009 | Schmidt et al. | 313/503 |

FOREIGN PATENT DOCUMENTS

DE    10349038 A1    5/2004

(Continued)

*Primary Examiner* — Nathan Ha
*Assistant Examiner* — Michael Jung
(74) *Attorney, Agent, or Firm* — Mark L. Beloborodov

(57) ABSTRACT

An illumination device includes an active layer, such as a blue LED, covered with a first luminescent ceramic converter layer and partially covered with a second luminescent ceramic converter layer. The first and second conversion layers convert primary photons emitted by the active layer into photons of different, longer wavelengths. The color point of the illumination device can be adjusted by adjusting the relative size of the second conversion layer.

12 Claims, 4 Drawing Sheets

FOREIGN PATENT DOCUMENTS

| | | |
|---|---|---|
| EP | 1566848 A2 | 8/2005 |
| WO | 2006003930 A1 | 2/2006 |
| WO | 2006072918 A1 | 7/2006 |
| WO | 2006097868 A2 | 9/2006 |

* cited by examiner

|  | LED + YAG:Ce | LED + YAG:Ce + eCAS (0.25 mm$^2$) | LED + YAG:Ce + eCAS (0.50 mm$^2$) |
|---|---|---|---|
| CCT [K] | 4403 | 3618 | 2857 |
| Ra | 67 | 84 | 95 |
| Duv | 0.025 | 0.009 | 0 |
| x | 0.3774 | 0.4081 | 0.4458 |
| y | 0.4338 | 0.414 | 0.4045 |
| LE | 376 | 306 | 254 |
| R1 | 59.6 | 81.7 | 98 |
| R2 | 73.2 | 85 | 95.4 |
| R3 | 88.6 | 87 | 88.7 |
| R4 | 63.6 | 83.5 | 96 |
| R5 | 59.1 | 78.7 | 95.1 |
| R6 | 63.8 | 77.3 | 91.3 |
| R7 | 86.6 | 95 | 96.4 |
| R8 | 47.6 | 78.7 | 98.1 |
| R9 | -56.9 | 39 | 94 |
| R10 | 39.1 | 62.9 | 85.2 |
| R11 | 56.5 | 79 | 94.4 |
| R12 | 25.1 | 47.2 | 73.7 |
| R13 | 61.8 | 81.6 | 97.3 |
| R14 | 93.5 | 92.1 | 92.2 |
| Lm(350) | 53.6 | 39.2 | 30.4 |
| LE[lm/W] | 376 | 306 | 254 |
| W[opt] | 0.14 | 0.13 | 0.12 |

FIG. 4

ILLUMINATION DEVICE, PARTICULARLY WITH LUMINESCENT CERAMICS

The invention relates to an illumination device comprising an active light emitting layer and at least two conversion layers for converting the wavelength of the light emitted by the active layer.

An illumination device comprising a light emitting diode (LED) that is covered with one or more luminescent ceramics is disclosed in the US 2005/0269582 A1. The document describes several designs of such a device in which light emitted by the LED sequentially passes through a first and a second luminescent ceramics, where it is partially converted to longer wavelengths that add to the final output spectrum of the device. This output spectrum can therefore be adjusted by varying in an elaborate procedure the composition of the luminescent ceramics.

Based on this situation it was an object of the present invention to provide an alternative design of an illumination device, wherein it is particularly desirable that the output spectrum of the device can be adjusted by simple and well reproducible means. Moreover, a white output light with a color temperature lower than 5000 K and a high color rendering index is especially desirable.

The illumination device according to the present invention comprises the following components:

An active layer for emitting light consisting of primary photons. The active layer usually converts a first kind of energy, for example supplied by an electrical current or voltage, into light energy. The emission of the active layer typically has a characteristic spectrum which can often be characterized by an associated wavelength, e.g. the wavelength where the spectrum has a peak.

A first and a second conversion layer for converting primary photons emitted by the active layer to different wavelengths. This means that the first conversion layer converts primary photons into photons of a longer, first wavelength. Similarly, the second conversion layer converts primary photons and/or photons with the aforementioned first wavelength into photons of a second wavelength that is longer than the converted wavelength and different from the first wavelength. It should be noted that the conversions will typically produce a spectrum comprising many wavelengths, in which case the "first" or "second" wavelength will refer to characteristic values of these spectra (e.g. their peak or center of gravity). Moreover, the illumination device shall comprise at least one such first and second conversion layer, i.e. it may optionally comprise more than two conversion layers.

The illumination device is further designed such that a part of the primary light can leave it (as useful light) without passing through the second conversion layer. A similar condition is not required (but also not prohibited) for the first conversion layer, which means that in some embodiments all primary light of the active layer has to pass through the first conversion layer before it can leave the illumination device. It should be noted that the designations as "first" and "second" conversion layer have simply been made for reference and do not imply any constructive, functional or other assumption or restriction.

In contrast to illumination devices where all primary light emitted by the active layer has to pass all present conversion layers before it can leave, the illumination device described above comprises in its overall light output a fraction of primary light that did not pass through the second conversion layer and that is therefore not affected by this layer. The percentage of this part of the light output can be adjusted by the geometrical design of the illumination device, wherein such an adjustment is usually easier, more robust and better reproducible to achieve than for example an adjustment of the chemical composition of a conversion layer or the optical thickness (here optical thickness is characterized by the mean pass length of transmitted light).

According to a preferred embodiment of the invention, the first conversion layer and/or the second conversion layer comprises a luminescent ceramic converter. Most preferably both conversion layers comprise luminescent ceramics of different composition for converting primary photons to different longer wavelengths. Luminescent ceramic converters have the advantage that they can be very well mechanically handled and for example be cut to desired shapes and thickness.

The first and/or the second conversion layer preferably comprises a material selected from the group consisting of $Y_3Al_5O_{12}$:Ce (YAG:Ce), $Lu_3Al_5O_{12}$:Ce (LuAG:Ce), Ca—SiAlON:Eu $[=(Ca_{1-x-y-z}Sr_xBa_yMg_z)_{1-n}Al_{1-a-c+b}B_aGa_cSi_{1-b}N_{3-b}O_b:Eu_n$, with $0 \leq x, y, z \leq 1$ with $x+y+z<1$, $0 \leq a \leq 1$, $0 < b \leq 1$, $0 \leq c \leq 1$, $0 < n \leq 1]$, Ca—SiAlON:Ce $[=(Ca_{1-x-y-z}Sr_xBa_yMg_z)_{1-n}Al_{1-a-b-c+b+n}B_aGa_cSi_{1-b-n}N_{3-b}O_b:Ce_n$, with $0 \leq x, y, z \leq 1$ and $x+y+z<1$, $0 \leq a \leq 1$, $0<b \leq 1$, $0 \leq c \leq 1$, $0<n \leq 1$ with $a+c-b-n<1]$, CaS:Eu, SrS:Eu, BaS:Eu, $Ca_2SiO_4$:Eu, $Ba_2SiO_4$:Eu, $Sr_2SiO_4$:Eu, $Ca_2Si_5N_8$:Eu, $Ba_2Si_5N_8$:Eu, $Sr_2Si_5N_8$:Eu, $SrSi_2O_2N_2$:Eu including their solid solutions with one or more suitable substituent elements, e.g. $(Y,Gd)_3Al_5O_{12}$:Ce or $(Ca,Mg,Sr)(Al,B,Ga)SiN_3$:Eu and also including exchange of isosterical subunits for example $AlO^+$ for $SiN^+$ as in e.g. $Ba_2Si_{5-x}Al_xN_{8-x}O_x$:Eu, to adjust luminescence and material properties. More information about these and other suitable luminescent ceramics can be found in the US 2005/0269582 A1 and the WO 2006/097868 A2, which are incorporated into the present text by reference. All given composition quantities denote the atomic ratio.

For compositions with an Eu-content of $0<n<0.002$ (atomic ratio) especially high color temperature with an especially high color rendering index (CRI) and R9-values (Ri values denote the color rendering indices according to the definition of the International Commission on Illumination (CIE)) could be achieved.

The active layer may in principle have any design, structure and composition that provide the desired emission of primary light. Thus it may for example be a resonance cavity light emitting diode, a laser diode, or a vertical cavity surface emitting laser. Preferably, the active layer comprises a light emitting diode (LED).

In a preferred embodiment, the primary light emitted by the active layer consists substantially of light with a wavelength smaller than 500 nm, i.e. of blue or ultraviolet (UV) light. Preferably more than 50%, most preferably more than 70% of the light intensity emitted by the active layer consists of such wavelengths. Starting with primary photons of such small wavelengths allows converting them to longer wavelengths which are still in the visible range. Thus the Correlated Color Temperature of the illumination device can be adjusted over a comparatively large range.

The illumination device optionally has an overall emission spectrum of white light with a Correlated Color Temperature (CCT) lower than 5000 K. Efficient white light sources are needed in many applications. It is therefore a significant advantage that the proposed design of the illumination device allows the realization of these characteristics.

In general, the active layer, the first conversion layer, and the second conversion layer can be arranged in many different ways (cf. examples discussed with reference to the Figures). In a preferred group of designs, the first conversion layer covers completely the emission surface of the active layer, wherein the term "emission surface" shall denote that part of the surface of the active layer through which primary light which contributes to the output of the illumination device finally leaves the active layer. The active layer will usually emit light isotropically in all directions, wherein light that does not leave the emission surface is (by definition) either lost or reflected back into the active layer. If the first conversion layer therefore completely covers the emission surface, this implies that all photons emitted by the active layer will have to pass through it, wherein typically only a fraction of these photons is converted to photons of a longer wavelength while the residual fraction leaves the first conversion layer unaffected. The present invention comprises however also the case that all primary photons are converted in the first conversion layer.

In another optional group of designs, which can favorably be combined with the aforementioned one, the second conversion layer covers a part of the emission surface of the first conversion layer and/or a part of the emission surface of the active layer, wherein the term "emission surface" is used in this context with a similar meaning as above. The covered fraction of the emission surface of the first conversion layer and/or the active layer preferably ranges between 10% and 90%, most preferably between 20% and 30%. By selecting the percentage of the covered emission surface area, the overall emission spectrum of the illumination device can readily be adjusted as desired.

In another embodiment of the invention, the emission wavelength of the second conversion layer is longer than the emission wavelength of the first conversion layer. In this respect, the "emission wavelength" of a conversion layer is defined as a characteristic value of the emission spectrum of that layer when it is exposed to primary photons, particularly as the wavelength of the spectral emission peak (which usually exists). If the second conversion layer has a longer emission wavelength than the first conversion layer, it can in principle convert light emitted by the first conversion layer and not only (as usual) primary light of the active layer.

These and other aspects of the invention will be apparent from and elucidated with reference to the embodiment(s) described hereinafter. These embodiments will be described by way of example with the help of the accompanying drawings in which:

FIG. 4 is a table with characteristic data measured for different illumination devices;

Like reference numbers in the Figures refer to identical or similar components.

White light emitting diodes are usually produced by additive color mixing using phosphors (i.e. luminescent materials) that convert primary UV or blue light to white light. For the conversion of blue light into the green and red spectral range it is for example known to use YAG:Ce phosphor, wherein this combination allows to achieve (only) Correlated Color Temperatures (CCT) higher than 4500 K near the black body line. The color rendering index increases in this case with the color temperature.

For producing LEDs with low color temperatures and a good color rendering, red emitting phosphors are additionally used, for example CaS:Eu, Ca—SiAlON:Eu=$(Ca_{1-x-y-z}Sr_xBa_yMg_z)_{1-n}$ $Al_{1-a-b-c+b}B_aGa_cSi_{1-b}N_{3-b}O_b$:$Eu_n$, with $0 \leq x, y, z \leq 1$ with $x+y+z<1$, $0 \leq a \leq 1$, $0<b \leq 1$, $0 \leq c \leq 1$ with $a+c-b<1$, $0<n \leq 1$;

Ca—SiAlON:Ce=$(Ca_{1-x-y-z}Sr_xBa_yMg_z)_{1-n}$ $Al_{1-a-c+b+n}B_aGa_cSi_{1-b-n}N_{3-b}O_b$:$Ce_n$, with $0 \leq x, y, z \leq 1$ with $x+y+z<1$, $0 \leq a \leq 1$, $0<b \leq 1$, $0 \leq c \leq 1$, $0<n \leq 1$ with $a+c-b-n<1$;

BSSNE=$EA_{2-z}Si_{5-a}Al_aN_{8-b}O_b$:$Eu_2$ with $0<a \leq 4$, $0<b \leq 4$ and $0<z \leq 0.2$, wherein EA is at least one of the alkaline earth metals of the group Ca, Sr, Ba.

In practice, the application of more than one phosphor material in the form of a powder turns out to be extremely difficult, resulting in a low efficiency and an impaired control of color temperature. Using a ceramic phosphor component together with a second phosphor in powder form is also unfavorable, as the phosphor powder comprises a binder (usually silicone) that may deteriorate and discolor at higher temperatures and thus reduce the device efficiency. Moreover, the proper adjustment of the color point is difficult in these approaches as the thickness of the powder layer is difficult to control. Thus there is a need for phosphor converted illumination devices with a Correlated Color Temperature lower than 5000 K, a good color rendering (e.g. a color rendering index Ra$\geq$80), a precise control of the color point, and a high efficiency.

To address the aforementioned issues, it is proposed here to use an active layer emitting primary blue or UV light that is covered with a first and a second luminescent ceramic converter layer of different emission characteristics, wherein at least one of these converter layers (in the following by definition the second converter layer) covers the active layer only partially.

Figure 1:
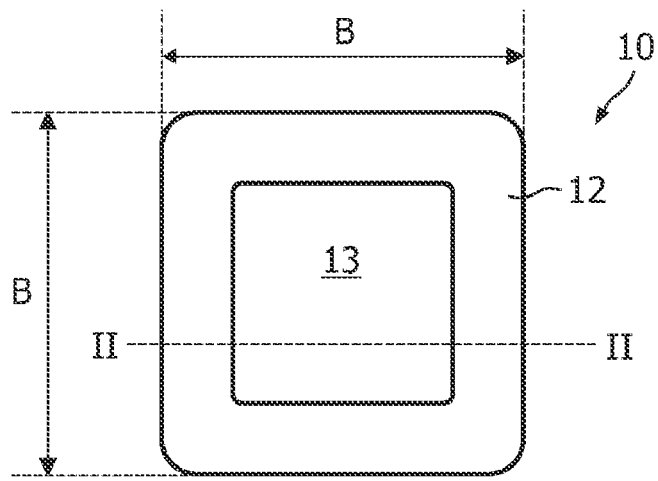
FIG. 1 shows schematically a top view of an illumination device according to the present invention.
Figure 2:
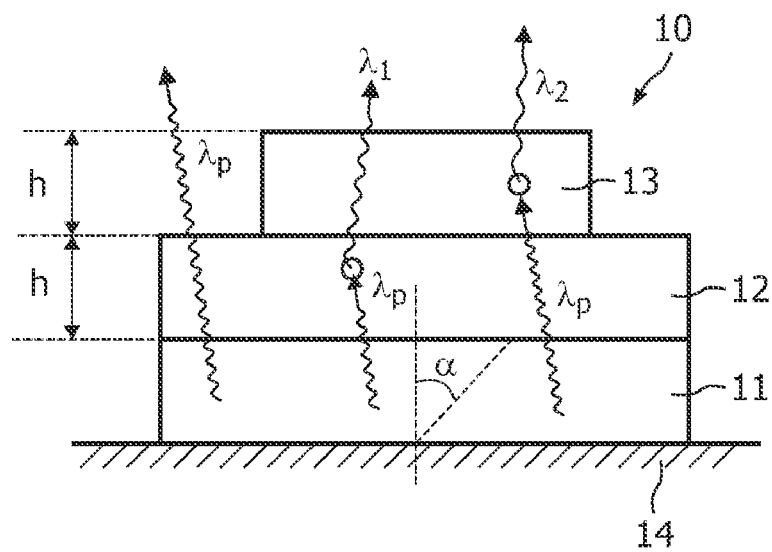
FIG. 2 shows a section along the line II-II of FIG. 1.

A particular embodiment of this general principle is illustrated by the Figures, wherein FIGS. 1 and 2 show schematically a possible geometry of the corresponding illumination device 10. This device 10 comprises the following components:

An active layer 11 that emits primary photons of a wavelength $\lambda_p$, wherein $\lambda_p$ is typically $\leq$480 nm. Though the active layer 11 is drawn as one unique block, it may comprise a dedicated substructure. In particular it may be realized by a blue emitting LED which comprises a light emitting semiconductor layer sandwiched between two electrodes with adjacent (n, p) conductive regions (not shown). Typical materials that can be used for such a blue LED are for example Indium Gallium Aluminum Nitride layers processed by MOVPE processes to form a p-n junction. The bandgap energy within the material system is controlled by composition to produce the desired primary emission wavelength (O. B. Shchekin et al., Appl. Phys. Lett. 89, 071109 (2006) "High performance thin-film flip-chip InGaN—GaN light emitting diodes").

The active layer 11 may be disposed on some carrier material or substrate 14, for example a thin silicon wafer or a heat conducting ceramic. All surfaces of the active layer 11 besides the top "emission surface" may have a reflective coating to minimize loss of primary light.

A first luminescent ceramic converter layer 12 that completely covers the emission surface of the active layer 11 and that can convert primary photons of wavelength $\lambda_p$ emitted by the active layer into photons of a longer wavelength $\lambda_1$. A part of the primary photons $\lambda_p$ can however pass the first converter layer 12 unaffected. The first converter layer 12 of the shown example has a quadratic shape with a width B of about 1 mm. An exemplary material of this layer 12 is YAG:Ce.

A second luminescent ceramic converter layer 13 that is disposed on top of the first converter layer 12 but covers only a fraction of its surface. The second converter layer 13 converts photons of wavelength $\lambda_p$ emitted by the active layer 11 into photons of a longer wavelength $\lambda_2$ (typically in the red spectral range). As $\lambda_2$ is usually larger than $\lambda_1$, the second converter layer 13 may optionally also convert photons $\lambda_1$ emitted by the first conversion layer 12 to the longer wavelength $\lambda_2$.

A suitable material for the second luminescent ceramic converter layer 13 is Ca—SiAlON:Eu, which converts incident light almost completely into red light. The second converter layer 13 covers typically about 25% of the surface area of the first converter layer 12, and typical thicknesses of the first and second converter layers 12, 13 is about 100 μm.

All surfaces in contact are preferably glued with a transparent optical coupling layer with a typical thickness of about 5 μm and a refractive index larger than 1.3 such as silicone.

The described design realizes a warm white phosphor converted LED produced exclusively with luminescent ceramic converter material (without silicone binder) that is stable even at operation temperatures above 200° C. A further advantage of the design is that the fraction of the light that is converted to red is primarily determined by the size of the red emitting, second converter layer 13. As the size of this layer can be determined very accurately with a precision of a few μm, the fraction of the red light and therefore the color point of the whole illumination device 10 can be controlled with high precision.

Figure 3:
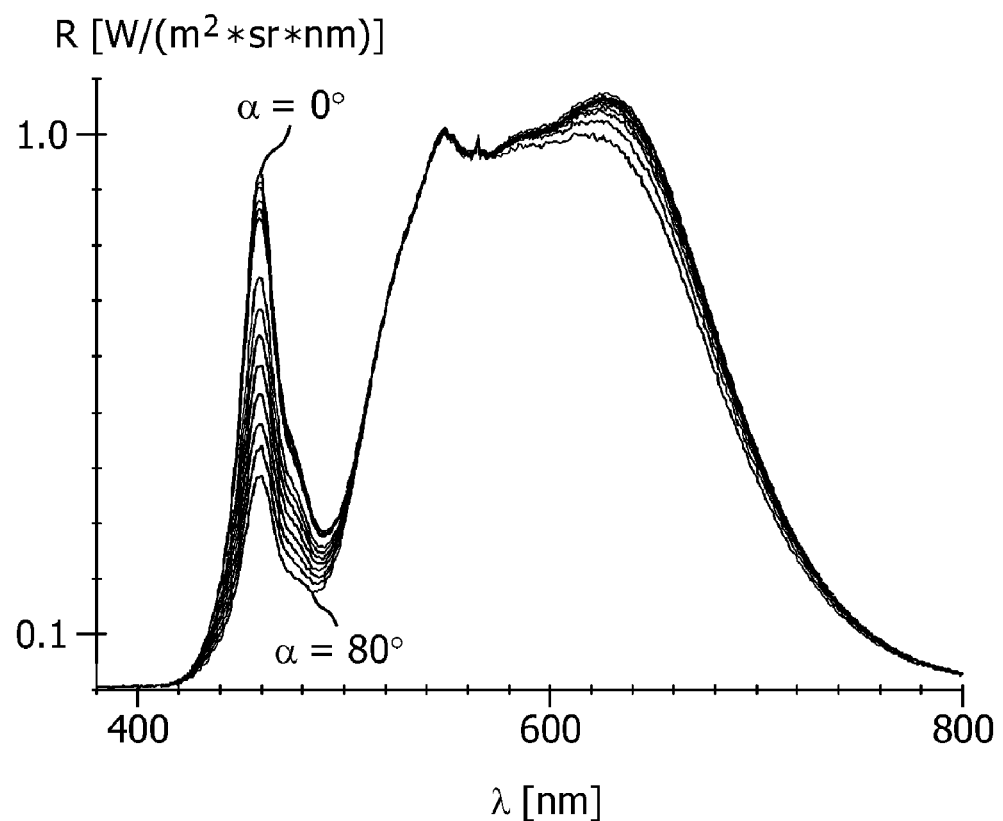
FIG. 3 shows the emission spectrum of an illumination device like that of FIG. 1 under different angles of observation.

FIG. 3 shows the normalized radiance (vertical axis) in dependence on the wavelength (horizontal axis) for an illumination device like that described above as measured under different observation angles α (cf. FIG. 2). Further parameters of the setup were as follows:
active layer: blue LED
first luminescent ceramic converter layer: YAG:Ce
second luminescent ceramic converter layer: Ca—SiAlON:Eu covering 25% of the surface
operating current: 350 mA
emitted flux: 39.2 lumen
CCT: 3618 K
color rendering index: Ra=84
distance from the black body line [CIE 1960 color coordinates]: Duv=0.009
color point [CIE 1931]: x=0.4081, y=0.414
lumen equivalent: LE=306 lm/W.

The diagram shows that the relation between the emissions of the two luminescent ceramic layers is depending only slightly on the angle α of observation.

FIG. 4 shows a table of characteristic data of three different illumination devices (measured at an operating current of the LED of 350 mA), namely
a device with a blue LED covered by a YAG:Ce luminescent ceramic only (second column);
a device with a blue LED covered by a YAG:Ce and to 25% of its area with an Ca—SiAlON:Eu luminescent ceramic (third column);
a device with a blue LED covered by a YAG:Ce and to 50% of its area with an Ca—SiAlON:Eu luminescent ceramic (last column).

The symbols Ra, R1, ... R14 denote the color rendering indices according to the definition of the International Commission on Illumination (CIE), and W denotes the optical power of the emitted light, i.e. the quotient of emitted lumen flux and lumen equivalent.

Figure 5:
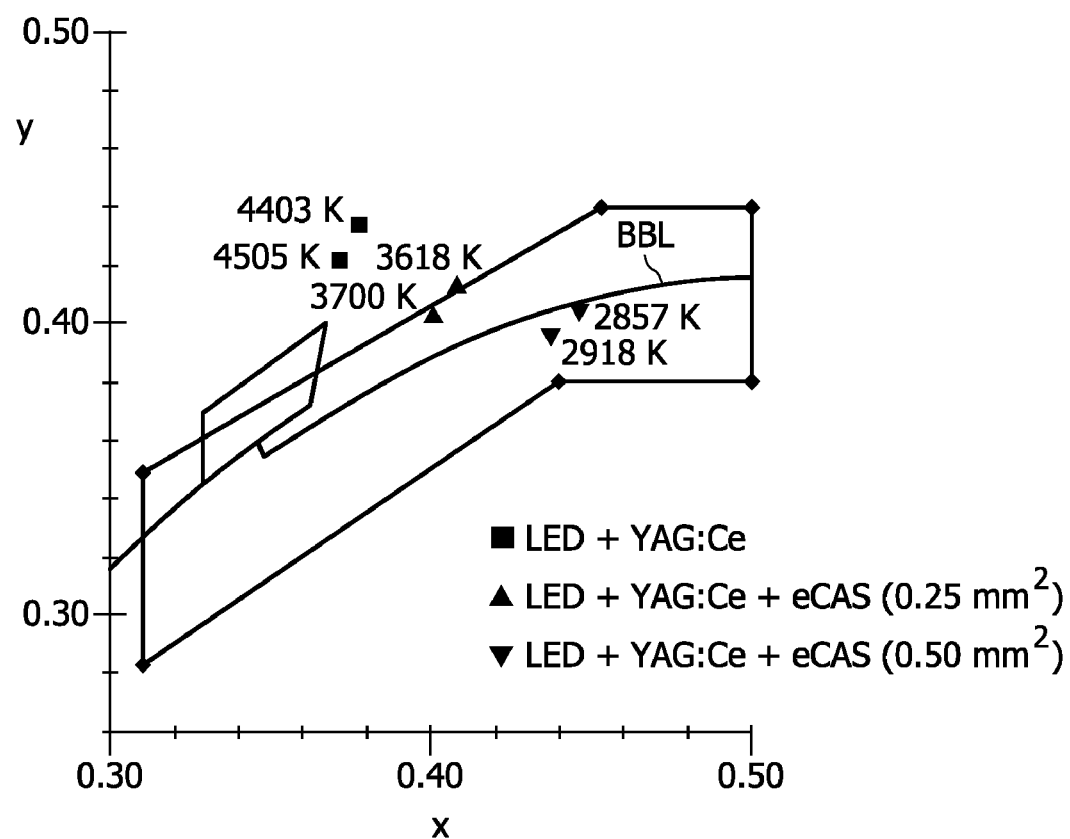
FIG. 5 represents graphically the color coordinates (CIE 1931) of the illumination devices listed in FIG. 4.

FIG. 5 shows the color point data of the aforementioned table (data points corresponding to 4403 K, 3618 K, 2857 K) and data measured at a higher current of 1000 mA (data points corresponding to 4505 K, 3700 K, 2918 K) in a color diagram. The diagram illustrates very well that the color point can selectively be shifted to the black body line BBL by choosing the (relative) area of the second luminescent ceramic converter layer appropriately. The point where the black body line is crossed is determined by the thickness of the first converter plate and the spectral emission properties of the Ca—SiAlON:Eu ceramic.

The described illumination device can of course be modified in many ways. Thus different materials than the mentioned ones can be used, and the corresponding layers can have other shapes and relative dimensions. Moreover, it is possible to use more than one active layer and/or more than two luminescent ceramic converter layers.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:

1. An illumination device comprising
an active layer having an emission surface for emitting primary photons;
a first light conversion layer formed directly over the emission surface of the active layer, wherein the first light conversion layer completely covers the emission surface of the active layer; and
a second light conversion layer formed directly over an exit surface of the first light conversion layer, wherein the second light conversion layer partially covers the exit surface of the first light conversion layer leaving uncovered portions of the exit surface that are near an entire periphery of the exit surface,
wherein the emission surface of the active layer is parallel to the exit surface of the first light conversion layer, and
wherein a part of the primary photons can leave the illumination device through the exit surface of the first light conversion layer without passing through the second light conversion layer.

2. The illumination device according to claim 1, wherein the first light conversion layer comprises a luminescent ceramics.

3. The illumination device according to claim 1, wherein the second light conversion layer comprises a luminescent ceramics.

4. The illumination device according to claim 1, wherein at least one of the first light conversion layer and second light conversion layer comprises a material selected from the group consisting of $Y_3Al_5O_{12}$:Ce (YAG:Ce), Ca—SiAlON:Eu, Ca—SiAlON:Ce, CaS:Eu, SrS:Eu, BaS:Eu, $Ca_2SiO_4$:Eu, $Ba_2SiO_4$:Eu, $Sr_2SiO_4$:Eu, $Ca_2Si_5N_8$:Eu, $Ba_2Si_5N_8$:Eu, $Sr_2Si_5N_8$:Eu, $SrSi_2O_2N_2$:Eu including their solutions with one or more substituent elements.

5. The illumination device according to claim 4, wherein the Eu-content n is within the range of 0<n<0.002.

6. The illumination device of claim 4, wherein the substituent elements include $(Y,Gd)_3Al_5O_{12}:Ce$ or $(Ca,Mg,Sr)(Al,B,Ga)SiN_3:Eu$ and the isosterical subunits include $AlO^+$ for $SiN^+$.

7. The illumination device according to claim 1, wherein the active layer comprises a light emitting diode.

8. The illumination device according to claim 1, wherein all the primary photons have a wavelength smaller than 500 nm.

9. The illumination device according to claim 1, wherein the illumination device has an emission spectrum of white light with a Correlated Color Temperature smaller than 5000 K.

10. The illumination device according to claim 1, wherein the second light conversion layer covers 10% to 90% of an emission surface of the first light conversion layer.

11. The illumination device according to claim 1, wherein an emission wavelength of the second light conversion layer is longer than an emission wavelength of the first light conversion layer.

12. The illumination device of claim 1, wherein the second light conversion layer covers 20% to 30% of an emission surface of the first light conversion layer.

* * * * *